United States Patent [19]

McAloon

[11] Patent Number: 6,001,298
[45] Date of Patent: Dec. 14, 1999

[54] METHOD FOR MAKING A MOULD

[75] Inventor: Kevin Thomas McAloon, Warrington, United Kingdom

[73] Assignee: Zeneca Limited, London, United Kingdom

[21] Appl. No.: 09/071,746

[22] Filed: May 4, 1998

Related U.S. Application Data

[63] Continuation-in-part of application No. PCT/GB96/02543, Oct. 18, 1996.

[30]     Foreign Application Priority Data

Nov. 4, 1995 [GB] United Kingdom .................. 9522656

[51] Int. Cl.$^6$ ............................. B29C 35/08; B29C 41/02
[52] U.S. Cl. .......................... 264/401; 264/219; 264/308; 264/328.1
[58] Field of Search .................................... 264/219, 308, 264/328.1, 401

[56]          References Cited

U.S. PATENT DOCUMENTS

| | | |
|---|---|---|
| 4,618,632 | 10/1986 | Su . |
| 4,822,665 | 4/1989 | Scholz et al. . |
| 5,641,448 | 6/1997 | Yeung et al. ........................... 264/401 |
| 5,807,519 | 9/1998 | Suzuki et al. ........................... 264/401 |
| 5,874,041 | 2/1999 | Matsumura et al. .................... 264/401 |

FOREIGN PATENT DOCUMENTS

| | | |
|---|---|---|
| 386 473 | 9/1990 | European Pat. Off. . |
| 425 441 | 5/1991 | European Pat. Off. . |
| 642 903 | 3/1995 | European Pat. Off. . |

OTHER PUBLICATIONS

Modern Plastics International, vol. 24, No. 11, Nov. 1, 1994, pp. 25/26, XP000521262 "Prototyping that Bypasses Model Construction", p. 25, paragraph: "Photoformable resin allows concurrent engineering".

*Primary Examiner*—Leo B. Tentoni
*Attorney, Agent, or Firm*—Pillsbury Madison & Sutro LLP

[57]          ABSTRACT

A method for making a mold including the steps of (a) forming a layer of a photocurable composition containing a U.V. transparent filler; (b) irradiating the layer formed in step (a) with light in a predetermined pattern thereby forming a solid cross-sectional layer of the desired mold; and (c) repeating steps (a) and (b) on the previously formed solid cross-sectional layer until the mold is formed. The filler is preferably phyllosilicate clay mineral and the mold has heat and pressure shock resistant properties making it particularly useful for injection molding.

13 Claims, No Drawings

METHOD FOR MAKING A MOULD

This is a Continuation-in-Part International Appln. No. PCT/GB96/02543 filed Oct. 18, 1998 which designated the U.S.

FIELD OF THE INVENTION

This invention relates to processes for preparing and using moulds, particularly injection moulds.

BACKGROUND OF THE INVENTION

The most widely used means for processing thermoplastic materials into articles of desired shape is by injection moulding. A typical injection moulding cycle commences by locking mould halves together under a considerable clamping force. Hot, molten thermoplastic material is then injected rapidly into the mould cavity and pressure is maintained whilst the thermoplastic material cools and solidifies. Finally, when the material has cooled to a suitably rigid state, the mould halves are opened and the article of desired shape is ejected. The cycle then begins again to prepare the required number of shaped articles.

To be of value in injection moulding, the moulds need to be capable of withstanding repeated temperature and pressure shocks resulting from the injection of hot materials. The mould should withstand many cycles without melting, deforming or cracking.

An alternative method for producing three-dimensional articles called 'stereolithography' is also known. This method comprises curing successive layers of a photopolymerisable liquid using a computer-controlled light source, e.g. a laser, to give the desired article. Stereolithography has been used to prepare prosthetic devices, medical models and a variety of other articles having complex internal structures. Hull's U.S. Pat. Nos. 4,575,330, 4,752,498 and Hideo Kodama's article in Rev. Sci. Instrum. 52 (11), 1770–1773, November 1981 describe this method in more detail.

A limitation of stereolithography is that it can only produce three dimensional articles from photocurable liquids. If one requires an article made from polythene, nylon or other meltable materials which are not derived from a photocurable liquid then stereolithography is of no direct use.

International patent application No.PCT/US89/03303 proposed a method for preparing a ceramic mould wherein a disposable pattern is produced by stereolithography, a ceramic material is formed around the pattern by applying a refactory material (e.g. an aqueous ceramic slurry) and the pattern is destroyed and removed by heating the mould. The patterns used in this application were therefore unstable to heat and were used only once.

SUMMARY OF THE INVENTION

According to the present invention there is provided a method for making a mould comprising the steps:
a) forming a layer of a photocurable composition containing a U.V transparent filler;
b) irradiating the layer formed in step a) with light in a predetermined pattern thereby forming a solid cross-sectional layer of the desired mould; and
c) repeating steps a) and b) on the previously formed solid cross-sectional layer until the mould is formed.

DESCRIPTION OF PREFERRED EMBODIMENTS

The photocurable composition preferably contains from 1 to 70%, more preferably 9 to 60%, especially 10 to 40% by weight of U.V transparent filler.

The U.V (i.e. ultraviolet) transparent filler can be organic, inorganic or a mixture of organic and inorganic U.V transparent fillers. The U.V transparent filler is preferably such that if a film of 0.05 mm thickness is prepared by photocuring a photocurable composition containing 10% by weight of the filler and light of wavelength 325 nm is irradiated onto the film, at least 70% of the light is transmitted through the film, relative to the amount of light transmitted through a control film of the same thickness containing no filler. The % of light transmitted through the film can be measured using a spectrophotometer, for example a Pye-Unicam lambda 15.

Preferred U.V transparent organic fillers have an average molecular weight from between 500 and 500,000, more preferably between 1000 and 350,000. Examples include PVC polymers, e.g. EVIPOL EP6779, and polymethyl methacrylates, especially those having a molecular weight of 12,500 to 350,000.

The preferred U.V transparent inorganic fillers are in the form of platelets. The platelets preferably have a length at their longest point of 0.1 $\mu$m to 100 $\mu$m, more preferably 0.5 $\mu$m to 80 $\mu$m, especially 1 $\mu$m to 50 $\mu$m. Preferably the width of the platelets is about the same as the length. A preferred aspect ratio for the platelets is 1 to 4, more preferably 1 to 10, especially 1 to 5. Above about 100 $\mu$m the platelets can give the mould an undesirable rough surface and difficulties can occur during step b) of the process. Below about 0.1 $\mu$m the platelets can increase viscosity of the photocurable composition making processing in a stereolithography apparatus slower and more difficult.

The U.V transparent filler is preferably a crystalline phyllosilicate clay mineral, e.g. kaolinite, serepentine, smectite, montmorillonite, Illite, chlorite, palygorskite-sepiolite, more preferably an aluminium silicate which is free from transition metals, especially mica. The preference for mica arises because it has a low tendency to settle-out from the photocurable compositions, it has good transparency to U.V.light, a low tendency to refract or reflect incident light and allows moulds to be prepared having particularly good dimensional accuracy and heat resistance.

The mica is preferably a potassium, magnesium or lithium aluminium-silicate, more preferably a potassium aluminium silicate.

Examples of mica include natural and synthetic micas, for example muscovite, phlogopite, biotite, lepidolite, roscoelite, Zinnwaldite, fuchsite, fluorophlogopite and paragonite.

The U.V transparent inorganic filler can, if desired, have been treated with an organic silyl compound, for example to promote adhesion to the monomers or reduce flocculation on standing.

In a preferred embodiment the photocurable composition containing a U.V. transparent filler contains a dispersant. We have found that dispersants help to keep the filler dispersed and lowers its viscosity. Examples of suitable dispersants include the Solsperse® hyperdispersants from Zeneca Limited, especially Solsperse® 26000 and 24000; Hyper PS-3 from ICI; BYK W9010 and CRG107.

Preferably the layers formed in step a) each independently have a thickness of 0.01 to 1 mm, more preferably 0.05 to 0.5 mm, especially 0.06 to 0.25 mm. Naturally the layers need not all be of the same thickness.

The number of times steps a) and b) are repeated will depend upon the height or width of the mould and the thickness of cross-sectional layers. Typically, however, steps a) and b) are repeated at least 10 times, preferably at least 20 times.

The mould can be a complete mould corresponding to the surface shape of a desired article or a part thereof, e.g. a mould half. Preferably the method is for making an injection mould.

The light used in step b) is preferably U.V or visible light, more preferably U.V light, especially U.V light from a laser, especially a laser whose movement is controlled by a computer.

To enable processing in stereolithography apparatus the photocurable composition preferably has a viscosity at 30° C. of less than 4500 c.p.s., more preferably less than 4000 c.p.s., especially less than 3500 c.p.s.

The photocurable composition preferably contains photocurable epoxy, vinyl ether or (meth)acrylate monomers or oligomers or a mixture thereof, especially a mixture of (meth)acrylates. Mixtures of (meth)acrylates are described in EP 425,441 A2, EP 562,826A1, Canadian Patents No 2,079,652, 2,063,982, 2,007,295, 2,028,541, 2,088,031 and 2,028,537. Several photocurable (meth)acrylates are commercially available, for example Cibatool XB5149 and Somos 3110.

The photocurable composition preferably comprises at least one monofunctional or multifunctional (meth)acrylate monomer or oligomer, a photoinitiator and a U.V transparent filler. Examples of meth(acrylate) monomers and oligomers include the following and combinations thereof:

mono(meth)acrylates, e.g. t-butyl(meth)acrylate, 1,5-pentanediol (meth)acrylate, N,N-diethylaminoethyl (meth)acrylate, ethylene glycol(meth)acrylate, 1,4-butanediol(meth)acrylate, diethylene glycol(meth) acrylate, caprolactone (meth)acrylate and urethane (meth) acrylates; di(meth)acrylates, e.g. hexamethylene glycol di(meth)acrylate, 1,3-propanediol di(meth)acrylate, 1,5-pentanediol (meth)acrylate, decamethylene glycol di(meth)acrylate, 1,4-cyclohexane diol di(meth)acrylate, 2,2-dimethylolpropane di(meth)acrylate, glycerol di(meth)acrylate, tripropylene glycol di(meth)acrylate, 2,2-di-(p-hydroxyphenyl)-propane di(meth)acrylate, triethylene glycol di(meth)acrylate, polyoxyethyl-2,2-di(p-hydroxy)propane di(meth)acrylate, di-(3-(meth)acryloxy-2-hydroxy propyl) ether of bisphenol-A, di-(2-(meth) acryloxyethyl) ether of bis-phenol-A, di-(3-methacryloxy-2-hydroxypropyl) ether of 1,4-butanediol, butylene glycol di(meth)acrylate, 2,2,4-trimethyl-1,3-pentanediol di(meth)acrylate, 1-phenyl ethylene-1,2-di (meth)acrylate, 1,4-benzenediol di(meth)acrylate, urethane di(meth)acrylates, ethoxylated bisphenol A di(meth)acrylates, 1,10-decanediol di(meth)acrylate, di-(3-acryloxy-2-hydroxypropyl) ether of bisphenol A oligomers, di-(3-(meth)acryloxy-2-hydroxyl alkyl) ether of bisphenol A oligomers, and propoxylated neopentyl glycol di(meth)acrylate;

tri-, tetra- and penta-(meth)acrylates, e.g. ethoxylated trimethylolpropane tri(meth)acrylates, ethoxylated pentaerythritol tri(meth)acrylate, dipentaerythritol monohydroxy penta(meth) acrylate, propoxylated trimethylol propane tri(meth)acrylates, glycerol tri(meth)acrylate, trimethylolpropane tri(meth)acrylate, pentraerythritol tri (meth)acrylate, polyoxyethylated trimethylolpropane tri (meth)acrylate, pentaerythritol tetra(meth)acrylate, 1,2,4-butanetriol tri(meth)acrylate; urethane poly(meth) acrylates and polyester poly(meth)acrylates; and mixtures thereof. Also useful are ethylenically unsaturated compounds, e.g., diallyl fumarate, styrene, 1,4-diisopropenyl benzene, 1,3,5-triisopropyl benzene, alkylene or a polyalkylene glycol di(meth)acrylate prepared from an alkylene glycol having 2 to 15 carbons or a polyalkylene ether glycol having 1 to 10 ether linkages, e.g., those having a plurality of addition polymerizable ethylenic linkages particularly when present as terminal linkages.

Examples of photoiniators which are useful in the composition either alone or in combination are described in U.S. Pat. No. 2,760,863 and include vicinal ketaldonyl alcohols, e.g. benzoin, pivaloin; acyloin ethers, e.g., benzoin methyl and ethyl ethers, benzil dimethyl ketal; α-hydrocarbon-substituted aromatic acyloins, including α-methylbenzoin, α-allybenzoin, α-phenylbenzoin, 1-hydroxycyclohexyl phenol ketone, diethoxyphenyl acetophenone and 2-methyl-1-[4-methylthio)-phenyl]-2-morpholinopropan-1-one; acylphosphine oxides and sulphides; and onium salt photoinitiators.

Preferred onium salt photoiniators are aryl diazonium, diaryliodonium; triaryl sulphonium, triaryl selenonium, dialkyl phenacyl sulphonium, triaryl sulphoxonium, aryloxydiaryl sulphoxonium and dialkylphenacyl sulphoxonium salts (especially their salts with $BF_4^-$, $PF_6^-$, $AsF_6^-$ or $SbF_6^-$), more preferably the diaryliodonium and triaryl sulphonium salts which are relatively easy to prepare on a commercial scale.

The photocurable composition preferably comprises or consists essentially of:
(a) 23 to 55 parts, more preferably 28 to 50 parts, of an ethoxylated bisphenol A di(meth)acrylate;
(b) 15 to 45 parts, more preferably 20 to 40 parts, in total of urethane(meth) acrylate and/or urethane di(meth)acrylate;
(c) 5 to 25 parts, more preferably 8 to 18 parts, of a tri-(meth)acrylate;
(d) 0.01 to 10 parts, more preferably 1 to 7 parts, of a photoinitiator;
(e) 5 to 60 parts, more preferably 5 to 40 parts, especially 10 to 35 parts, of a U.V transparent filler; and
(f) 0 to 15 parts, more preferably 1 to 3 parts of a dispersant; wherein the total number of parts of (a)+(b)+(c)+(d)+(e)+(f) add up to 100.

The method for making a mould is preferably computer controlled, more preferably it uses a stereolithography apparatus, for example the SLA 250, 350 or 500 supplied by 3D -Systems or the Stereos 300, 400 and 600 supplied by EOS.

Use of a mould according to the invention for injection moulding is a further aspect of the invention.

According to a third feature of the present invention there is provided a process for preparing a three dimensional article comprising the steps:
(i) making a mould having a cavity which matches the surface shape of the desired three dimensional article by a method comprising steps a), b) and c) defined above;
(ii) introducing a liquid into the mould cavity;
(iii) solidifying the liquid; and
(iv) removing the solidified liquid from the mould cavity.

The liquid is preferably a thermoplastic material or a metal, more preferably nylon, polyethylene, polypropylene, polystyrene, high impact polystyrene, acrylonitrile butadiene styrene or a mixture of polyproplene and glass fibre polycarbonate.

The liquid preferably has a melting point above 20° C., more preferably above 50° C., especially above 100° C., more especially above 150° C. Preferably the liquid has a melting point below 300° C. The liquid is preferably introduced into the mould cavity by pouring or, more preferably, under high pressure, for example by injection.

The liquid can be solidified by allowing it to cool or cooling it below its melting point, by reducing pressure on the liquid, or both.

In a preferred embodiment, the process of the third feature of the invention is performed and steps (ii) to (iv) are then repeated, preferably more than 5 times, especially more than 50 times, more especially more than 90 times.

The invention also relates to the use of mica as a U.V. transparent filler for the manufacture of moulds, preferably injection moulds, by stereolithography.

The invention is further illustrated by the following examples in which all parts and percentages are by weight unless specified otherwise.

The following abbreviations are used in the Examples:

Alumina MA95 Amorphous aluminium oxide powder from ICI PLC.
Mica SX300: Muscovite from Microfine Minerals Ltd.
SR348: Ethoxylated bisphenol A dimethacrylate of MW 452 from Sartomer.
NR 2720: NeoRad 2720 from Zeneca Resins, a urethane-acrylate oligomer.
DAR 1173: Ph—CO—C(OH)(CH$_3$)CH$_3$ (a photoinitiator)
IRG 184: C$_6$H$_{10}$(OH)C(O)Ph (a photoinitiator).
CN-435: CH$_3$CH$_2$C—[CH$_2$(CH$_2$CH$_2$O)$_n$COCH=CH$_2$]$_3$ wherein n=5 of MW 956 from Sartomer.

EXAMPLE 1 TO 9

Compositions comprising photocurable monomers and fillers were prepared by stirring together at 25–50° C. the number of parts by weight of components listed in Table 1 below. After stirring for a few hours, the mixtures were transferred into separate bottles for storage prior to testing.

TABLE 1

| Example No | SR-348 | NR-2720 | CN-435 | DAR 1173 | IRG 184 | Alumina MA95 | MICA SX 300 |
|---|---|---|---|---|---|---|---|
| 1 (Control) | 45.2 | 34.7 | 15.1 | — | 5.0 | — | 0 |
| 2 | 45.2 | 34.7 | 15.1 | — | 5.0 | — | 25 |
| 3 | 45.2 | 34.7 | 15.1 | — | 5.0 | — | 20 |
| 4 | 45.2 | 34.7 | 15.1 | — | 5.0 | — | 15 |
| 5 | 45.2 | 34.7 | 15.1 | — | 5.0 | — | 10 |
| 6 (Comparative) | 45.0 | 34.5 | 15.0 | 5.5 | — | 33 | — |
| 7 | 45.2 | 34.7 | 15.1 | — | 5.0 | — | 33# |
| 8 | 45.2 | 34.7 | 15.1 | — | 5.0 | — | 33# |
| 9 | 45.2 | 34.7 | 15.1 | — | 5.0 | — | 33# |

In Examples 7,8 and 9 the Mica SX 300 had been treated respectively with 0.27 parts of stearic acid, stearoyl gallate (C$_{17}$H$_{35}$COOPh(OH)$_3$) and CH$_2$=C(CH$_3$)CO$_2$(CH$_2$)$_3$Si(OCH$_3$)$_3$ which were found to reduce the tendency of Mica to flocculate during storage.

Testing

Heat-shock resistance was measured by forming a layer of each composition into a template measuring 2 cm×1 cm×0.1 cm and irradiating with U.V light at a dose of 3.0 m Jcm$^{-2}$ to give a solid oblong sheet. The sheet was stood at ambient temperature overnight, then subjected to a series of heat-shock cycles induced by successive 5 second immersions in a) solder at 270° C.; then b) water at 25° C. The number of such cycles required to damage the sheet (e.g. by surface cracking and/or total fracture) was recorded as its "heat-shock resistance" and are shown in Table 2 below. If the sheet survived 50 cycles, the damage was scored 0 to 5, where 0=severe damage and 5=no damage.

The viscosity of the liquid resins was measured using a Brookfield RVT DV-II viscometer, with No.27 spindle at 50 rpm; tensile modulus, strength at break and elongation at break were measured on an Instron 1122 tensometer using dumbells prepared from liquid compositions cured a described above and conforming to ISO 527-1 and are shown in Table 2 below.

TABLE 2

| Example No. | Viscosity @ 30° C. mPa.s (cps) | Tensile Modulus MPa | Strength @ break MPa | Elongation @ break % | Heat shock resistance (cycles to destruction) |
|---|---|---|---|---|---|
| 1 (Control) | 780 | 650 | 26 | 10 | 30–50,2/5 |
| 2 | 2800 | 1250 | 39 | 5.9 | >50,5/5 |
| 3 | 1830 | 1070 | 34 | 8.2 | >50,5/5 |
| 4 | 1260 | 980 | 33 | 8.2 | >50,5/5 |
| 5 | 1080 | 888 | 31 | 7.9 | >50,5/5 |
| 6 (Comparative) | 2100 | 1062 | 29 | 6.5 | >50,5/5 |
| 7 | 4130 | 888 | 20 | 4.1 | >50,5/5 |
| 8 | 3420 | 1000 | 26.2 | 4.5 | >50,5/5 |
| 9 | 3210 | 1085 | 38.5 | 7 | >50,5/5 |

EXAMPLE 10

The compositions prepared in Examples 1 to 9 were evaluated in a SLA 250 stereolithography apparatus to asses their suitability for use in the stereolithographic production of moulds. The processing parameters Ec (minimum energy to cure), Dp (penetration depth) and comments are shown in Table 3.

TABLE 3

| Composition from Example No | Stereolithography processing parameters | | Comments |
|---|---|---|---|
| | E$_3$ (mJcm$^{-2}$) | D$_p$ (mm) | |
| 1 (Control) | 5.3 | 0.175 | Normal values for clear acrylate resin |
| 2 | 3.4 | 0.147 | Composition usable in stereolithography |
| 3 | 4.63 | 0.143 | Composition usable in stereolithography |
| 6 (Comparative | 1.51 | 0.059 | Composition too sensitive; curls badly during stereolithography processing |

Comparative composition 6 (contains alumina instead of Mica) would not cure properly and, due to bad curling, is not suitable for the stereolithographic preparation of moulds.

EXAMPLE 11

Moulds were prepared layer by layer on a stereolithography apparatus using the composition from Example 2 and, as control, the mica-free composition from Example 1. The mould was placed in an aluminium support and loaded into a injection moulding machine.

The moulds were used to prepare three dimensional articles by injecting molten ABS (Acrylonitrile Butadiene Styrene copolymer) into them under the following conditions:

| Nozzle Temperature | 200° C. |
| Cooling Time | 45 seconds |
| Screw speed | 30 mm/seconds |
| Injection Pressure | 70 bar (805 bar specifically) |
| Injection time | 3.5 seconds |
| After pressure | 25 bar |
| After pressure time | 5 seconds |
| Air cooling after ejection | 8 seconds |
| Total Cycle time | 64 seconds |

TABLE 4

| Composition from Example No | Performance in injection moulding | | | |
|---|---|---|---|---|
| | first damage | further damage | test stopped after | Comments |
| 1 | shot 5 | — | 5 shots | cavity on inlet side broke after 5 shots 5 models obtained |
| 2 | shot 26 | shot 81 | 82 shots | 68 models obtained |
| 2 | shot 32 | shot 36* | 100 shots | 95 models obtained |

*-only slight damage.

EXAMPLE 12

Assessment of U.V. Transparency

Photocurable compositions were prepared consisting of SR 348 (38.8 parts), NR2720 (32.1 parts), CN435 (14 parts), IRGCURE 184 (5.1 parts) and the filler indicated in Table 5 below (10 parts), wherein all parts are by weight.

Each composition was cast to the film thickness shown in Table 5 and cured under a U.V. lamp in an identical manner. U.V. transmission of the films was then measured using a Perkin-Elmer Lambda 15 UV/VIS Spectrophotometer set to 325 nm and corrected to the value for a 50 μm film. The % of '325 nm light transmitted is shown in the final column of Table 5.

TABLE 5

| Filler | Film thickness | Absorbance of film @ 325 nm** | % Transmission of UV light at 325 nm | % UV light transmitted vs unfilled film |
|---|---|---|---|---|
| None (Control) | 50.5 | 0.66 | 22 | n/a |
| Mica SX 400 | 49.6 | 0.77 | 17 | 77 |
| Kaolin | 33.5 | 0.698 | 20.0 | 91 |
| Talc | 37.3 | 0.72 | 19.0 | 82 |
| Alumina MA95 | 47.9 | 1.22 | 6.0 | 27 |
| Bismuth oxide | 42.6 | 1.05 | 8.9 | 40 |
| Borosilicate glass | 40.8 | 1.11 | 7.8 | 35.5 |
| Crystabolite silica | 40 | 1.18 | 6.6 | 30 |
| Titanium dioxide | 39.6 | >4 | 0.01 | <0.05 |
| PVC Evipol 6779 | 38.5 | 0.8 | 15.8 | 72 |

** Normalised to 50 micron thickness

EXAMPLES 13–31

Use of Dispersants

Further photocurable compositions were prepared having the compositions described in Table 6 below. All quantities described in the table are parts by weight.

The viscosity of each composition is described in the final column.

TABLE 6

| Example No. | IRG 184 | SR 348 | NR-2720 | CN-435 | Mica | Dispersant (parts) | Viscosity Cps @ 30° C. |
|---|---|---|---|---|---|---|---|
| 13 | 3.5 | 31.6 | 24.3 | 10.6 | 30 | None | 13000 |
| 14 | 3.5 | 31.6 | 24.3 | 10.6 | 30 | A (0.5) | 8150 |
| 15 | 3.5 | 31.6 | 24.3 | 10.6 | 30 | A (1.0) | 5250 |
| 16 | 3.5 | 31.6 | 24.3 | 10.6 | 30 | A (1.5) | 4800 |
| 17 | 3.5 | 31.6 | 24.3 | 10.6 | 30 | A (3.0) | 5350 |
| 18 | 3.5 | 31.6 | 24.3 | 10.6 | 30 | B (0.5) | 11200 |
| 19 | 3.5 | 31.6 | 24.3 | 10.6 | 30 | B (1.0) | 7550 |
| 20 | 3.5 | 31.6 | 24.3 | 10.6 | 30 | B (1.5) | 6020 |
| 21 | 3.5 | 31.6 | 24.3 | 10.6 | 30 | C (5) | 5400 |
| 22 | 3.5 | 31.6 | 24.3 | 10.6 | 30 | C (10) | 4900 |
| 23 | 3.5 | 31.6 | 24.3 | 10.6 | 30 | C (15) | 6250 |
| 24 | 3.5 | 31.6 | 24.3 | 10.6 | 30 | C (20) | 6370 |
| 25 | 4.0 | 36.2 | 27.8 | 12.0 | 20 | None | 3200 |
| 26 | 4.0 | 36.2 | 27.8 | 12.0 | 20 | D (0.5) | 2520 |
| 27 | 4.0 | 36.2 | 27.8 | 12.0 | 20 | D (1.0) | 2420 |
| 28 | 4.0 | 36.2 | 27.8 | 12.0 | 20 | D (1.5) | 2520 |
| 29 | 3.5 | 31.6 | 24.3 | 10.6 | 30 | E (20) | 2700 |
| 30 | 3.5 | 31.6 | 24.3 | 10.6 | 30 | F (5) | 18600 |
| 31 | 3.5 | 31.6 | 24.3 | 10.6 | 30 | F (10) | 21900 |

Dispersant A is BKY W9010, from K&K - Polymerics Univar.
Dispersant B is BKY W996, from K&K - Polymerics Univar.
Dispersant C is Solsperse ® 24000, from Zeneca Limited.
Dispersant D is Hypermer PS-3, from ICI.
Dispersant E is Solsperse ® 26000, from Zeneca Limited.
Dispersant F is cetyl trimethylammonium bromide.

Materials
Cibatool 5170 Epoxy Stereo lithography resin from Ciba-Geigy
Tamsil-10 Microcrystalline silica, median particle size 2.1 μm from Lawrence Industries

EXAMPLES 32 TO 35

The compositions listed in Table 7, comprising photocurable epoxy resin (Cibatool 5170) and filler were prepared by stirring together to 30° C.

TABLE 7

| Example No | Cibatool 5170 w/w% | Tamsil-10 w/w% |
|---|---|---|
| 32 (Control) | 100 | 0 |
| 33 | 80 | 20 |
| 34 | 70 | 30 |
| 35 | 50 | 50 |

Testing

The viscosity of the filled resins dispersions were measured using a Brookfield RVT DV-II viscometer, with a Spindle No. 27 at 50 rpm at 30° C. (Table 8).

Samples were prepared for tensile testing by curing the liquid resin formulations in a dumbbell test specimen mould (gauge length=25 mm, thickness=1 mm width=5 mm) by irradiating with UV light in a Parker light box (bulb H 200 wat/inch) for 320 sec. The cured samples were stored for 24 hrs at ambient temperature before the tensile modulus was measured using an Instron 1122 tensometer at 30° C. (crosshead speed of 5 mm/min) (Table 8).

TABLE 8

| Example No | Modulus @ 30° C. MFa | Viscosity @ 30° (cP) |
|---|---|---|
| 32 (Control) | 908 | 184 |
| 33 | 1149 | 316 |

TABLE 8-continued

| Example No | Modulus @ 30° C. MFa | Viscosity @ 30° (cP) |
|---|---|---|
| 34 | 1542 | 510 |
| 35 | 1693 | 1820 |

EXAMPLE 36

The composition prepared in Example 35 was evaluated in a SLA 250 stereolithography apparatus to assess its suitability for use in the stereolithographic production of moulds. The processing parameters Ec (minimum energy to cure), Dp (penetration depth) and comments are shown in

TABLE 9

| Composition from Example No | Stereolithography processing parameters | | Comments |
|---|---|---|---|
| | Ec (mJcm$^{-2}$) | Dp (mm) | |
| 32 (control) | 13.5 | 0.122 | Unfilled epoxy resin |
| 34 | 11.55 | 0.103 | Composition useable in stereolithography |
| 35 | 10.57 | 0.100 | Composition useable in stereolithography |

EXAMPLE 37

Mould inserts were prepared layer by layer on a SLA 250 stereolithography apparatus using the composition from Example 35, and as a control the unfilled composition of Example 32. The mould inserts were back-filled with aluminium filled epoxy resin and placed in a aluminium support and loaded into an injection moulding machine (Battenfield DS-2000).

The moulds were used to prepare three dimensional articles by injecting molten ASB (Acrylonitrile Butadiene Styrene grade Polylac ABS 717C copolymer from Amari Plastics) into them under the following conditions:

| Nozzle temperature | 195° C. |
|---|---|
| Cooling time | 37 secs. |
| Injection pressure | 1500 psi |
| Shot weight | 31 g |

TABLE 10

| Composition from example No | Performance in injection moulding | | | |
|---|---|---|---|---|
| | first damage | further damage | test stopped after | Comments |
| 1 (control) | 6 | — | 6 | mould failed |
| 4 | 101 $^{(a)}$ | — | 400 | performance >400 mouldings |

$^{(a)}$ - loss of a small chip from the core side resulting from damage sustained during assembly of the mould prior to injection moulding.

I claim:

1. A method for making a heat shock resistant mould capable of multiple use in a process of introducing a liquid at a temperature of 100 to 300° C. into the mould and solidifying the liquid which comprises the steps of:

a) forming a layer of a photocurable composition containing at least 10% by weight a U.V transparent filler;

b) irradiating the layer formed in step a) with light in a predetermined pattern thereby forming a solid cross-sectional layer of the desired mould; and c) repeating steps a) and b) on the previously formed solid cross-sectional layer until the mould is formed.

2. A method according to claim 1 wherein the U.V transparent filler is such that 70% of light of wavelength 325 nm is transmitted through a film of 0.05 mm thickness prepared by photocuring a photocurable composition containing 10% by weight of the filler relative to the amount of light transmitted through a control film of the same thickness containing no filler.

3. A method according to claim 1 wherein the U.V transparent filler is a crystalline phyllosilicate clay mineral.

4. A method according to claim 1 wherein the U.V transparent filler is mica.

5. A method according to claim 1 wherein the mould is an injection mould.

6. A method according to claim 1 wherein the photocurable composition has a viscosity at 30° C. of less than 4500 c.p.s.

7. A method according to claim 1 wherein the photocurable composition contains photocurable epoxy, vinyl ether or (meth)acrylate monomers or oligomers or a mixture thereof.

8. A method according to claim 1 wherein the light used in step b) is U.V light from a laser whose movement is controlled by a computer.

9. A method according to claim 1 which uses stereolithography apparatus.

10. A process for preparing a three dimensional article comprising the steps:

(i) making a mould as claimed in claim I having a cavity which matches the surface shape of the desired three dimensional article;

(ii) introducing a liquid at a temperature of 100 to 300° C. into the mould cavity;

(iii) solidifying the liquid; and (iv) removing the solidified liquid from the mould cavity.

11. A process according to claim 10 wherein the liquid is introduced into the mould cavity by pouring or under high pressure.

12. A process according to claim 10 wherein the liquid has a melting point above 100° C.

13. A process according to claim 10 wherein steps (i) to (iv) are performed and then steps (ii) to (iv) are repeated.

* * * * *